US012777944B2

(12) United States Patent
Liu et al.

(10) Patent No.: US 12,777,944 B2

(45) Date of Patent: Oct. 27, 2026

(54) HIGH INTEGRATION SUBSTRATE INTEGRATED WITH PASSIVE DEVICE, AND PRODUCTION METHOD THEREFOR

(71) Applicant: BOE Technology Group Co., Ltd., Beijing (CN)

(72) Inventors: Yingwei Liu, Beijing (CN); Ke Wang, Beijing (CN); Zhanfeng Cao, Beijing (CN); Qi Yao, Beijing (CN); Guangcai Yuan, Beijing (CN); Yuelei Xiao, Beijing (CN); Yue Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 504 days.

(21) Appl. No.: 18/271,117

(22) PCT Filed: Oct. 29, 2021

(86) PCT No.: PCT/CN2021/127289

§ 371 (c)(1), (2) Date: Jul. 6, 2023

(87) PCT Pub. No.: WO2023/070496

PCT Pub. Date: May 4, 2023

(65) Prior Publication Data

US 2024/0079354 A1 Mar. 7, 2024

(51) Int. Cl.

*H10W 20/40* (2026.01)
*H10W 44/00* (2026.01)
(Continued)

(52) U.S. Cl.

CPC ....... *H10W 44/601* (2026.01); *H10W 20/497* (2026.01); *H10W 70/685* (2026.01); *H10W 72/357* (2026.01); *H10W 72/367* (2026.01)

(58) Field of Classification Search

CPC .......... H10D 1/20; H10D 1/692; H10D 86/85; H05K 1/16; H10W 20/497; H10W 44/601;

(Continued)

(56) References Cited

U.S. PATENT DOCUMENTS

2007/0296537 A1 12/2007 Yoon et al.
2008/0174396 A1 7/2008 Choi et al.

(Continued)

FOREIGN PATENT DOCUMENTS

CN 102157514 A 8/2011
CN 110870067 A 3/2020
WO 2017/210814 A1 12/2017

*Primary Examiner* — Hoai V Pham

(74) *Attorney, Agent, or Firm* — WHDA, LLP

(57) ABSTRACT

The present disclosure provides a base plate integrating passive devices and a method for manufacturing the same, which relate to the technical field of radio frequency devices. The base plate integrating passive devices of the present disclosure includes a substrate base plate and the passive devices disposed on the substrate base plate, the passive devices including at least an inductor, the inductor including a plurality of open ring portions arranged and connected in sequence in a direction away from the base plate, wherein an interlayer dielectric layer is disposed between the open ring portions disposed adjacently, and the open ring portions disposed adjacently are electrically connected through a first via hole penetrating the interlayer dielectric layer; orthographic projections of any two of the open ring portions on the substrate base plate at least partially overlap.

17 Claims, 3 Drawing Sheets

(51) Int. Cl.
*H10W 70/685* (2026.01)
*H10W 72/30* (2026.01)

(58) Field of Classification Search
CPC ............. H10W 70/685; H10W 72/357; H10W 72/367
See application file for complete search history.

(56) References Cited

U.S. PATENT DOCUMENTS

| | | | | |
|---|---|---|---|---|
| 2011/0163413 | A1 | 7/2011 | Kim et al. | |
| 2019/0260344 | A1 | 8/2019 | Wang | |
| 2021/0057404 | A1 | 2/2021 | Liu et al. | |
| 2022/0301968 | A1 | 9/2022 | Viljanen et al. | |
| 2022/0320019 | A1* | 10/2022 | Chang | H10D 1/20 |

* cited by examiner

HIGH INTEGRATION SUBSTRATE INTEGRATED WITH PASSIVE DEVICE, AND PRODUCTION METHOD THEREFOR

TECHNICAL FIELD

The present disclosure relates to the technical field of radio frequency devices and, more particularly, to a base plate integrating passive devices and a method for manufacturing the same.

BACKGROUND

In the contemporary era, the consumer electronics industry changes rapidly. Mobile communication terminals represented by mobile phones, especially 5G mobile phones, have developed rapidly. More and more signal frequency bands need to be processed by mobile phones, and the number of radio frequency chips needed is also rising liking boats going up with the level of the water, while a form of mobile phones preferred by consumers is developing towards miniaturization, thinner size and longer battery life. In conventional mobile phones, there are a large number of discrete components on a radio frequency printed circuit board (PCB), such as resistors, capacitors, inductors, and filters. The discrete components have the disadvantages of a large volume, high power consumption, many solder joints and large changes in parasitic parameters. It is difficult to cope with future needs. Integrated passive devices with a small area, high performance, and good consistency are desirable for interconnection and matching between radio frequency chips.

SUMMARY

The present disclosure aims at solving at least one of the technical problems in the prior art by providing a base plate integrating passive devices and a method for manufacturing the same.

In a first aspect, embodiments of the present disclosure provide a base plate integrating passive devices, including a substrate base plate and passive devices disposed on the substrate base plate, the passive devices including at least an inductor, the inductor including a plurality of open ring portions arranged and connected in sequence in a direction away from the substrate base plate, wherein an interlayer dielectric layer is disposed between the open ring portions disposed adjacently, and the open ring portions disposed adjacently are electrically connected through a first via hole penetrating the interlayer dielectric layer; orthographic projections of any two of the open ring portions on the substrate base plate at least partially overlap.

Wherein, the interlayer dielectric layer includes a first passivation layer, a planarization layer, and a second passivation layer that are arranged in sequence in the direction away from the substrate base plate; the base plate includes N interlayer dielectric layers; the planarization layer in an M-th interlayer dielectric layer is in contact with the planarization layer in an (M−1)-th interlayer dielectric layer through a second via hole penetrating the second passivation layer in the (M−1)-th interlayer dielectric layer and the first passivation layer in the M-th interlayer dielectric layer, wherein $N \geq 2$, $2 \leq M \leq N$, and both M and N are integers.

Wherein orthographic projections of the second via holes at least partially in different layers on the substrate base plate at least partially overlap.

Wherein the planarization layer in the M-th interlayer dielectric layer is in contact with the planarization layer in the (M−1)-th interlayer dielectric layer through the plurality of second via holes.

Wherein orthographic projections of at least a portion of the first via holes on the substrate base plate have no overlap.

Wherein the passive devices further include a capacitor, the capacitor including a first polar plate and a second polar plate arranged in sequence at a side away from the substrate base plate; and the first polar plate is disposed in the same layer and of the same material as one of the plurality of open ring portions.

Wherein the first polar plate is disposed in the same layer as and is directly electrically connected to a first one of the plurality of open ring portions arranged in the direction away from the substrate base plate.

Wherein a thickness ratio of the second polar plate to the first polar plate is 1:100 to 1:30.

Wherein the base plate further includes a first connecting portion electrically connected to the second polar plate, and the first connecting portion is disposed in the same layer as a last one of the plurality of open ring portions arranged in the direction away from the substrate base plate.

Wherein the base plate further includes an adapting part disposed in the same layer as any one or more of the plurality of open ring portions located between the first one and last one of the plurality of open ring portions.

In a second aspect, embodiments of the present disclosure provide a method for manufacturing a base plate integrating passive devices, including: providing a substrate base plate and forming the passive devices on the substrate base plate, the passive device including an inductor, the inductor including a plurality of open ring portions arranged and connected in sequence in a direction away from the substrate base plate, wherein a step of forming the inductor includes forming a plurality of open ring portions in sequence on the substrate base plate and an interlayer dielectric layer being covered on the open ring portions, wherein the open ring portions disposed adjacently are electrically connected through a first via hole penetrating the interlayer dielectric layer; and orthographic projections of any two of the open ring portions on the substrate base plate at least partially overlap.

Wherein the step of forming the open ring portions includes: forming a metal thin film as a seed layer on the substrate base plate; forming a sacrificial layer at a side of the seed layer away from the substrate base plate, and etching the sacrificial layer to form slot portions corresponding to the open ring portions; electroplating the seed layer so that metal materials are formed at the slot portions; and removing the seed layer, and removing the metal materials other than the metal materials at the slot portions through a patterning process, to form the open ring portions.

Wherein the interlayer dielectric layer includes a first passivation layer, a planarization layer, and a second passivation layer that are arranged in sequence in the direction away from the base plate; the base plate includes N interlayer dielectric layers; the method further includes forming a second via hole penetrating the second passivation layer in the (M−1)-th interlayer dielectric layer and the first passivation layer in the M-th interlayer dielectric layer so that the planarization layer in the M-th interlayer dielectric layer is in contact with the planarization layer in the (M−1)-th interlayer dielectric layer, wherein $N \geq 2$, $2 \leq M \leq N$, and both M and N are integers.

Wherein the passive devices further include a capacitor, and a step of forming the capacitor includes: forming a first polar plate and a second polar plate in sequence at a side away from the base plate, wherein the first polar plate and one of the plurality of open ring portions are formed in a same patterning process.

Wherein the first polar plate and a first one of the plurality of open ring portions arranged in the direction away from the substrate base plate are formed in the same patterning process.

DETAILED DESCRIPTION OF THE EMBODIMENTS

In order to enable those skilled in the art to better understand the technical solution of the present disclosure, the present disclosure is further described in detail below in conjunction with the accompanying drawings and specific embodiments.

Unless otherwise defined, the technical terms or scientific terms used in the present disclosure shall have the usual meaning understood by persons with general skill in the art to which the present disclosure belongs. The terms "first", "second" and similar terms used in the present disclosure do not indicate any order, number or importance, but are only used to distinguish different components. Similarly, words such as "one", "a/an" or "the" and other similar words do not represent a quantitative limit, but rather represent the existence of at least one. Similar words such as "including" or "comprising" means that the element or object appearing before the word covers the element or object listed after the word and its equivalents, without excluding other components or objects. Similar words such as "connecting" or "connection" are not limited to physical or mechanical connections, but may include electrical connections, whether direct or indirect. "Up", "Down", "Left", "Right", etc. are only used to represent relative position relationships, and when the absolute position of the described object changes, the relative position relationship may also change accordingly.

Embodiments of the present disclosure provide a base plate integrating passive devices and a method for manufacturing the same. Wherein the passive devices such as capacitors, inductors, and resistors are integrated on the base plate to form a circuit structure. An integrated LC oscillating circuit on a base plate is taken as an example in the embodiments of the present disclosure. That is, at least inductive and capacitive devices are integrated on the base plate. It should be understood that devices such as resistors may also be integrated on the base plate according to the functionality and performance of the circuit.

Figure 1:
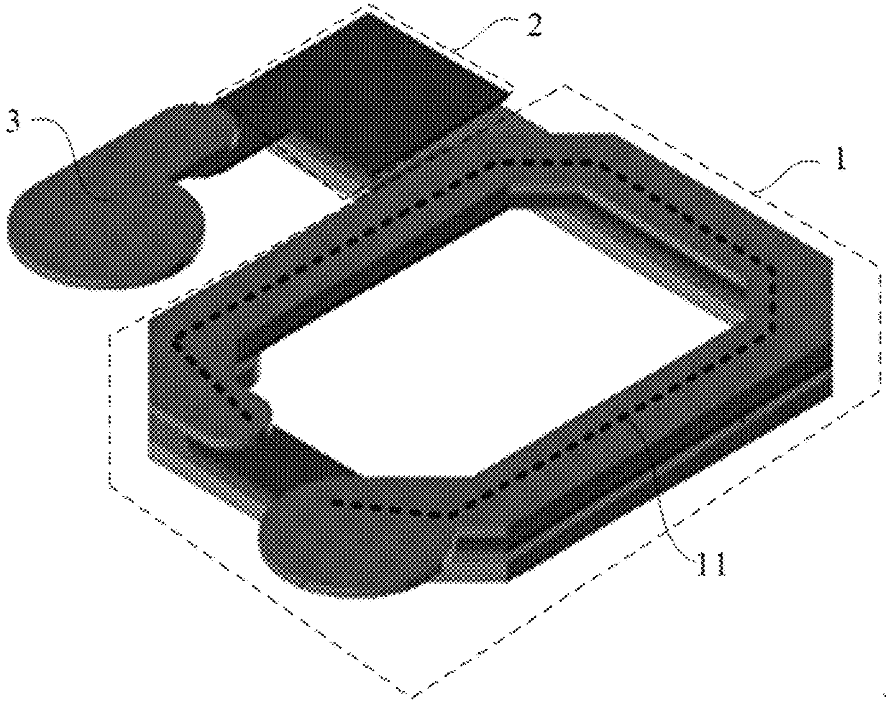
FIG. 1 is a perspective view of an inductor and a capacitor of a base plate integrating passive devices according to an embodiment of the present disclosure.
Figure 2:
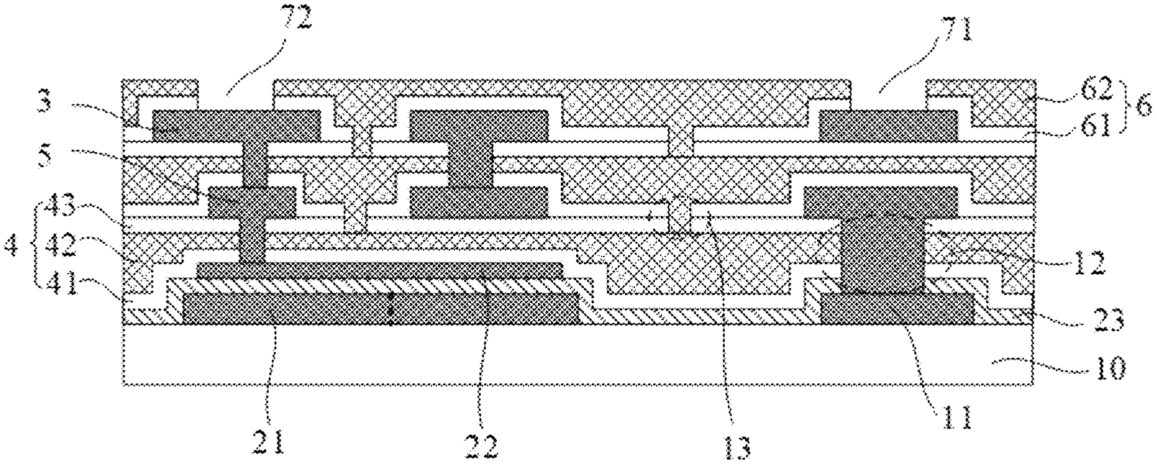
FIG. 2 is a sectional view of the base plate integrating passive devices according to an embodiment of the present disclosure.

In a first aspect, illustrated in conjunction with FIGS. 1 and 2, embodiments of the present disclosure provide a base plate integrating passive devices, including a substrate base plate 10, the passive devices disposed on the substrate base plate 10, the passive device including at least an inductor 1. The inductor 1 includes a plurality of open ring portions 11 arranged in sequence in a direction away from the substrate base plate 10 (i.e., a direction perpendicular to a plane where the substrate base plate 10 is located) and connected in sequence. Specifically, any one of the open ring portions 11 includes a head end and a tail end, and the head ends and the tail ends of adjacent open ring portions 11 are connected in sequence. Specifically, one side of any of the open ring portions 11 away from the substrate base plate 10 is covered with an interlayer dielectric layer 4, and the open ring portions disposed adjacently 11 are electrically connected via a first via hole 12 penetrating the interlayer dielectric layer 4; orthographic projections of any two open ring portions 11 on the substrate base plate 10 at least partially overlap in the embodiments of the present disclosure.

Since the orthographic projections on the substrate base plate 10 of any two open ring portions 11 of the inductor 1 formed on the substrate base plate 10 at least partially overlap in the embodiments of the present disclosure, space occupied by the inductor 1 on the substrate base plate 10 may be effectively reduced, contributing to a high degree of integration of the passive devices on the base plate.

In some embodiments, the orthographic projections of the open ring portions 11 of the inductor 1 on the some examples base plate 10 completely overlap, by using this way, the size of the inductor 1 is maximally reduced and the degree of integration on the base plate is improved.

In some embodiments, the interlayer dielectric layer 4 includes a first passivation layer 41, a planarization layer 42, and a second passivation layer 43 which are arranged in sequence in a direction away from the substrate base plate 10. In some embodiments, both the first passivation layer 41 and the second passivation layer 43 may use inorganic materials, and their materials may be the same or different; the inorganic materials include SiNx, SiNOx, and SiOx, and both the first passivation layer 41 and the second passivation layer 43 may use one or more of SiNx, SiNOx and SiOx that constitute a single layer structure or a laminated structure. A thickness of either the first passivation layer 41 or the second passivation layer 43 is around 2000-4000 Å. The planarization layer 42 uses an organic material. The organic material includes photosensitive OC materials, such as acrylic-based polymers and silicon-based polymers. The planarization layer 42 has a thickness of 2 μm to 5 μm, for example, the planarization layer 42 has a thickness of 3 μm.

Furthermore, when the inductor 1 has N open ring portions 11, the number of interlayer dielectric layers 4 is also N, wherein N≥2, and N is an integer. In this case, the planarization layer 42 in an M-th interlayer dielectric layer 4 is in contact with the planarization layer 42 in an (M−1)-th interlayer dielectric layer 4 through a second via hole 13 penetrating the second passivation layer 43 in the (M−1)-th interlayer dielectric layer 4 and the first passivation layer 41 in the M-th interlayer dielectric layer 4, wherein 2≤M≤N, and M is an integer. That is, for any of the second via holes 13 that penetrates the second passivation layer 43 of one of interlayer dielectric layers 4 disposed adjacently and the first passivation layer 41 of the other of the interlayer dielectric layers 4 disposed adjacently, such that the planarization layers 42 of the interlayer dielectric layers 4 disposed adjacently are in contact. Such an arrangement, generally, is because an organic insulating material is employed for the planarization layer 42, and in this case, the second via hole 13 is equivalent to a gas-permeable channel so that water, oxygen and the like absorbed by the planarization layers 42 are led out of the base plate.

Further, in some embodiments, orthographic projections on the substrate base plate 10 of at least a part of the second via holes 13 located in different layers at least partially overlap, that is, at least the second via holes 13 communicate in a direction perpendicular to the substrate base plate 10, thus facilitating leading water, oxygen and the like out of each planarization layer 42. In an embodiment, the second via holes 13 in a plurality of layers are included on the base plate, and a quantity of each layer of the second via holes 13 is more than one. The second via holes 13 in any pair of adjacent layers are arranged in a one-to-one correspondence, and the orthographic projections of the plurality of second via holes 13 arranged in one-to-one correspondence completely overlap on the substrate base plate 10. By this way, the water, oxygen and the like in the planarization layers 42 are led out as much as possible In some embodiments, the orthographic projections of at least a portion of the first via holes 12 for electrically connecting the open ring portions 11 disposed adjacently in the inductor 1 do not overlap on the substrate base plate 10. For example, the orthographic projections on the substrate base plate 10 of the i-th and (i+1)-th first via holes 12 in a direction away from the substrate base plate 10 do not overlap, wherein i≥1. In this way, a centralized arrangement of the first via holes 12 may be effectively avoided, reducing the risk of components of the inductor 1 appearing poor components. In some embodiments, the orthographic projections of the i-th and (i+1)-th first via holes 12 on the substrate base plate 10 in the direction away from the substrate base plate 10 do not overlap, and the orthographic projections of the i-th and (i+2)-th first via holes 12 on the substrate base plate 10 completely overlap. In this case, the patterns of the i-th and (i+2)-th open ring portions 11 in the direction away from the substrate base plate 10 may be the same, and the orthographic projections of the i-th and (i+2)-th open ring portions 11 on the substrate base plate 10 may overlap.

In some embodiments, the passive devices in the embodiments of the present disclosure may not only include the inductor 1, but also include a capacitor 2, wherein the capacitor 2 includes a first polar plate 21 and a second polar plate 22 arranged in sequence at a side away from the substrate base plate 10, and the first polar plate 21 may be arranged in the same layer and of the same material as one of the plurality of open ring portions 11 of the inductor 1. In this case, the first polar plate 21 of the capacitor 2 and one open ring portion 11 of the inductor 1 may be formed in one patterning process, thereby reducing steps and costs of the process. For example, the first polar plate 21 of the capacitor 2 may be disposed in the same layer as and is directly electrically connected to the first open ring portion 11 of the inductor 1 in the direction away from the substrate base plate, that is, the first polar plate 21 of the capacitor 2 may be an integral structure with the first open ring portion 11 of the inductor 1 in the direction away from the substrate base plate. In this case, a dielectric layer 23 may be disposed between the second polar plate 22 and the first polar plate 21 of the capacitor 2, and the dielectric layer 23 may include one or more materials of SiNx, SiNOx, and SiOx that constitute a single layer structure or a laminated structure, and thicknesses of which are both about 2000-4000 Å, for example, 1200 Å. In the embodiment of the present disclosure, the thickness of the second polar plate 22 of the capacitor 2 is less than the thickness of the first polar plate 21, for example, the thickness ratio of the second polar plate 22 to the first polar plate 2 is 1:100 to 1:30, preferably 1:60. Apparently, the thickness of the two polar plates of the capacitor 2 may also be specifically configured according to product requirements. In some embodiments, a first connecting portion 3 is further included in the embodiments of the present disclosure, and the first connecting portion 3 serves as a signal receiving terminal of the second polar plate 22 of the capacitor 2; with the second polar plate 22 of the capacitor 2, the first connecting portion 3 is disposed in the same layer as the last one of the plurality of open ring portions 11 arranged in the direction away from the substrate base plate 10. Further, in order to avoid a problem that the first connecting portion 3 and the second polar plate 22 are disconnected during connection due to a large distance between the first connecting portion 3 and the second polar plate 22, at least one adapting part 5 is further disposed between the first connecting portion 3 and the second polar plate 22, and the first connecting portion 3 is electrically connected to the second polar plate 22 through the adapting part 5. For example, the inductor 1 includes three open ring portions 11, the first polar plate 21 of the capacitor 2 is disposed in the same layer as the first open ring portion 11, and the dielectric layer 23 is assumed between the second polar plate 22 of the capacitor 2 and only the first polar plate 21. Hence the adapting part 5 may be disposed in the same layer as a second open ring portion 11, and the first connecting portion 3 may be arranged on the same layer as the 3rd open ring portion 11. In this case, the first connecting portion 3 is connected to the adapting part 5, and the adapting part 5 is connected to the second polar plate 22, thereby achieving the electrical connection between the first connecting portion 3 and the second polar plate 22. In some embodiments, the adapting part 5 is disposed in the same layer as any one or more of the plurality of open ring portions 11 in the inductor 1 located between the first one and last one of the plurality of open ring portions 11. In this way, process step may not be added, and the process costs may be reduced.

It should be noted that a protective layer 6 may be formed at a layer where the last open ring portion 11 and the first connecting portion 3 are located away from the substrate base plate, and a third via hole 71 and a fourth via hole 72 are formed in the protective layer 6; one end of the last open ring portion 11 of the inductor 1 is exposed at the third via hole 71, and the first connecting portion 3 is exposed at the fourth via hole 72, to facilitate loading signals for the capacitor 2 and the inductor 1. Wherein the protective layer may include a first passivation layer 61 and a planarization layer 62, and the first passivation layer 61 and the planarization layer 62 may be made of the same materials as the first passivation layer 41 and the planarization layer 42, respectively, and thus a detailed description thereof will not be provided here.

In some embodiments, the substrate base plate 10 in the embodiments of the present disclosure may be a glass base plate or a flexible film, and a material of the flexible film may be at least one of COP film, polyimide (PI), and polyethylene terephthalate (PET). The thickness of the substrate base plate 10 in the embodiments of the present disclosure may be about 0.5 mm to 1 mm, for example, the thickness of the substrate base plate 10 is 0.7 mm. A reverse stress layer may be formed on the substrate base plate 10 of the embodiments of the present disclosure to reduce glass warpage.

In a second aspect, the embodiments of the present disclosure provide a method for manufacturing a base plate integrating passive devices, which may be used to manufacture the base plate described above. The method may include providing a substrate base plate 10 and forming the passive devices on the substrate base plate 10, the passive devices including an inductor 1; the inductor 1 includes a plurality of open ring portions 11 arranged in sequence in a direction away from the substrate base plate 10 and connected in sequence; wherein, a step of forming the inductor 1 includes: forming a plurality of open ring portions 11 in sequence on the substrate base plate 10 and an interlayer dielectric layer 4 being covered on the open ring portions 11, and the open ring portions 11 disposed adjacently are electrically connected through a first via hole 12 penetrating the interlayer dielectric layer 4; the orthographic projections of any two of the open ring portions 11 on the substrate base plate 10 at least partially overlap.

To better understand the manufacturing method in the embodiments of the present disclosure, an inductor 1 having three open ring portions 11 is exemplified below. Not only the step of forming the inductor 1 but also the step of forming the capacitor 2 are included in the following description, but it should be understood that it is within the scope of the embodiments of the present disclosure that the capacitor 2 is not formed in the base plate. The manufacturing method in the embodiments of the present disclosure may specifically include the steps below.

Figure 3:
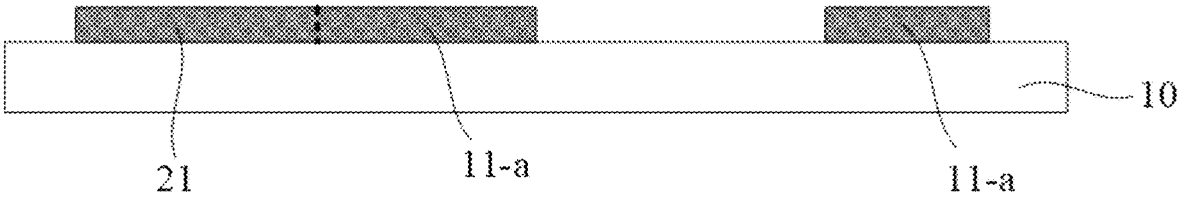
FIG. 3 is a sectional view of an intermediate product formed in step S11 of a method for manufacturing a base plate integrating passive devices according to an embodiment of the present disclosure.

S11, referring to FIG. 3, the substrate base plate 10 is provided, on which a patterning including a first polar plate 21 of the capacitor 2 and a first open ring portion 11*a* of the capacitor 2 is formed.

In some embodiments, step S1 may specifically include:

S111, the substrate base plate 10 is provided, a first sacrificial layer is formed on a first substrate base plate 10, and the first sacrificial layer is patterned to form a first open recess in the first sacrificial layer corresponding to the pattern to be formed of the first polar plate 21 of the capacitor 2 and the first open ring portion 11*a* of the capacitor 2.

Wherein the substrate base plate 10 may be a glass base plate or a flexible film, and a material of the flexible film may be at least one of COP film, polyimide (PI), and polyethylene terephthalate (PET); at this moment, in S1, the flexible COP film may be attached to the glass base plate through an optically clear adhesive (OCA adhesive), and then the glass base plate formed with the COP film is cleaned. Materials of the first sacrificial layer include, but are not limited to, organic materials, the organic materials include resin-based materials such as polyimide, epoxy resin, acryl, polyester, photoresist, polyacrylate, polyamide, siloxane, etc.

S112, a first metal film is evaporated at a side of the first sacrificial layer away from the substrate base plate 10 by using an electron beam evaporation apparatus, and the first metal film is taken as a first seed layer. The materials of the first metal thin film include but are not limited to at least one of copper (Cu), aluminum (Al), molybdenum (Mo), and argentum (Ag), and the thickness of the first metal thin film is about 100 nm to 500 nm, and further may be 50 nm to 35 μm, for example, 7 μm. In the following description, that the material of the first metal thin film is copper is taken as an example.

S113, placing the substrate base plate 10 finishing the above steps on a platform carrier of an electroplating machine, pressing an electrified wielding pad thereon, placing in a hole-filling electroplating tank (with a special hole-filling electrolyte in the tank), and applying an electric current. An electroplating solution keeps a continuous and rapid flow on a surface of the first metal thin film, positive ions in the electroplating solution acquire electrons on an inner wall of the first open recess and become atoms being deposited on the inner wall. Through the special hole-filling electrolyte with a special proportion of components, it is possible to mainly deposit metal copper at a high speed in the first open recess (the deposition speed is 0.5-3 μm/min), while the substrate base plate 10 is a smooth area, the deposition rate of metal copper on the two surfaces of the substrate base plate 10 is minimal (0.005-0.05 μm/min). As time increases, the metal copper on the inner wall of the first open recess grows thicker gradually to form a first metal film layer, and at this moment, the first metal film layer grows by more than 5 μm from the first metal thin film.

S113, the first metal film layer except those at the first open recess is removed, and the first sacrificial layer is removed to form the first open ring portion 11*a* of the inductor 1 and the first polar plate 21 of the capacitor 2.

It is mainly electroplating that has been employed so far to complete the first open ring portion 11*a* of the inductor 1 and the first polar plate 21 of the capacitor 2. It should be noted that only one exemplary method for forming the first open ring portion 11*a* of the inductor 1 and the first polar plate 21 of the capacitor 2 is given above, and in some embodiments, the patterns of the first open ring portion 11*a* of the inductor 1 and the first polar plate 21 of the capacitor 2 may be formed by a way of depositing the first metal film layer and then through exposure, development and etching. Methods for forming the first open ring portion 11*a* of the inductor 1 and the first polar plate 21 of the capacitor 2 are not enumerated here.

Figure 4:
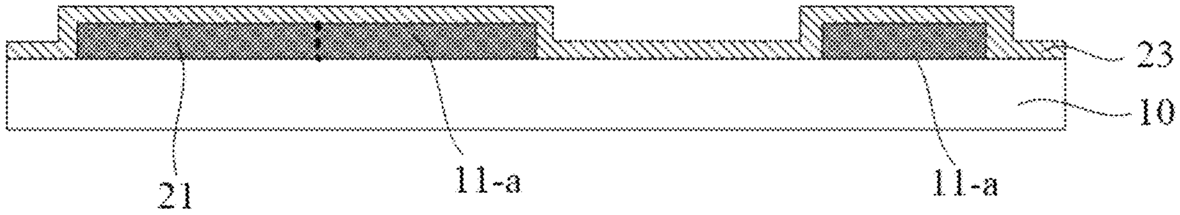
FIG. 4 is a sectional view of an intermediate product formed in step S12 of the method for manufacturing a base plate integrating passive devices according to an embodiment of the present disclosure.

S12, referring to FIG. 4, the dielectric layer 23 is formed as an intermediate medium of the capacitor 2 on the substrate base plate 10 that the above steps are completed.

In some embodiments, the dielectric layer 23 may specifically be one or more of SiNx, SiNOx, and SiOx that constitute a single layer structure or a laminated structure, and the single layer structure or the laminated structure has a thickness of about 2000-4000 Å, for example, 1200 Å.

Figure 5:
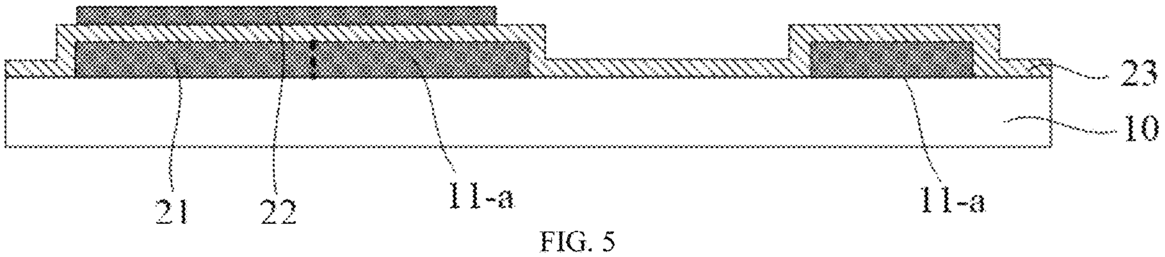
FIG. 5 is a sectional view of an intermediate product formed in step S13 of the method for manufacturing a base plate integrating passive devices according to an embodiment of the present disclosure.

S13, referring to FIG. 5, a step for forming the second polar plate 22 of the capacitor 2 through a patterning process on the substrate base plate 10 that the above steps are completed is shown.

In some embodiments, the material of the second polar plate 22 of the capacitor 2 may be the same as the material of the first polar plate 21, only that the thickness of the second polar plate 22 is somewhat thinner than the thickness of the first polar plate 21. The step of forming the second polar plate 22 of the capacitor 2 through a patterning process may specifically include depositing a second metal film by means of, for example, controlled sputtering, and forming a pattern including the second polar plate 22 of the capacitor 2 through exposure, development and an etching process.

Figure 6:
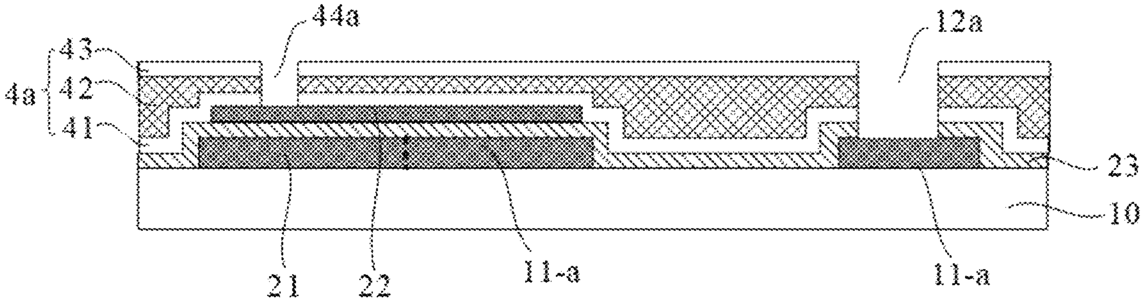
FIG. 6 is a sectional view of an intermediate product formed in step S14 of the method for manufacturing a base plate integrating passive devices according to an embodiment of the present disclosure.

S14, referring to FIG. 6, on the substrate base plate 10 that the above steps are completed, a first interlayer dielectric layer 4*a* is formed, and a 1st first via hole 12*a* and a 1st first adapting hole 44*a* penetrating the first interlayer dielectric layer 4 are formed through a patterning process. Wherein one end (an end not connected to the first polar plate 21 of the capacitor 2) of the first open ring portion 11 of the inductor 1 is exposed at the 1st first via hole 12*a*, and at least a portion of the second polar plate 22 of the capacitor 2 is exposed at the 1st first adapting hole 44*a*.

In some embodiments, the first interlayer dielectric layer 4*a* includes the first passivation layer 41, the planarization layer 42, and the second passivation layer 43 arranged in sequence away from the substrate base plate 10. In some embodiments, both the first passivation layer 41 and the second passivation layer 43 may be of inorganic materials, the materials of the first passivation layer 41 and the second passivation layer 43 may be the same or different, and the inorganic materials include SiNx, SiNOx, and SiOx; the first passivation layer 41 and the second passivation layer 43 may use one or more materials of SiNx, SiNOx, and SiOx to constitute a single layer structure or a laminated structure. The thicknesses of both the first passivation layer 41 and the second passivation layer 43 are about 2000-4000 Å. The planarization layer 42 is made of an organic material. The organic material includes photosensitive OC materials such as acrylic-based polymers and silicon-based polymers. The planarization layer 42 has a thickness of 2 μm to 5 μm, for example, the planarization layer 42 has a thickness of 3 μm.

In some embodiments, the step of forming the 1st first via hole 12*a* and the 1st first adapting hole 44*a* may specifically include: firstly, forming the first passivation layer 41 and the planarization layer 42 in sequence on the substrate base plate 10 on which the second polar plate 22 of the storage capacitor 2 is formed, and forming a first sub-via hole and a second sub-via hole penetrating the first passivation layer 41 and the planarization layer 42 through a patterning process, wherein at the first sub-via hole, one end of the first open ring portion 11 of the inductor 1 (an end not connected to the first polar plate 21 of the capacitor 2) is exposed, and at the second sub-via hole, at least a portion of the second polar plate 22 of the storage capacitor 2 is exposed; after this, forming the second passivation layer 43, and forming a third sub-via hole and a fourth sub-via hole penetrating the second passivation layer 43, wherein the third sub-via hole communicates with the first sub-via hole to form the first via hole 12*a*, and the fourth sub-via hole communicates with the second sub-via hole to form the first adapting hole 44*a*.

It should be noted that when the first interlayer dielectric layer 4*a* includes the first passivation layer 41, the planarization layer 42 and the second passivation layer 43 which are arranged in sequence away from the substrate base plate 10, step S14 may further include depositing the first passivation layer 41, the planarization layer 42 and the second passivation layer 43 in sequence, and then forming the 1st first via hole 12 and the 1st first adapting hole 44*a* penetrating the first passivation layer 41, the planarization layer 42, and the second passivation layer 43 through one patterning process.

Figure 7:
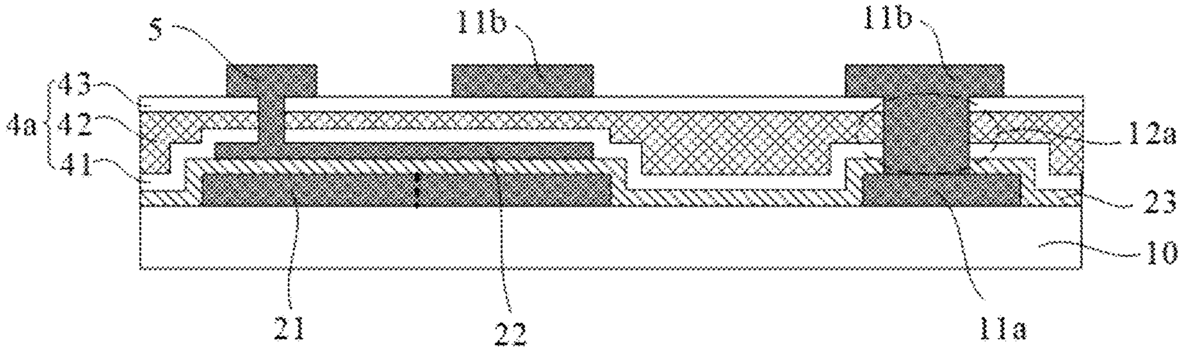
FIG. 7 is a sectional view of an intermediate product formed in step S15 of the method of manufacturing a base plate integrating passive devices according to an embodiment of the present disclosure.

S15, referring to FIG. 7, on the substrate base plate 10 that the above steps are completed, a pattern including the second open ring portion 11*b* of the inductor 1 and the adapting part portion 5 is formed through a patterning process. Wherein, the second open ring portion 11*b* is connected to the first open ring portion 11*a* through the 1st first via hole 12*a*, and the adapting part 5 is connected to the second polar plate 22 of the capacitor 2 through the 1st first adapting hole 44*a*.

In some embodiments, the processing used to form the second open ring portion 11*b* of the inductor 1 and the adapting part 5 in step S15 is the same to the processing used in step S11, for example, by electroplating copper, hence the description thereof will not be repeated here.

Figure 8:
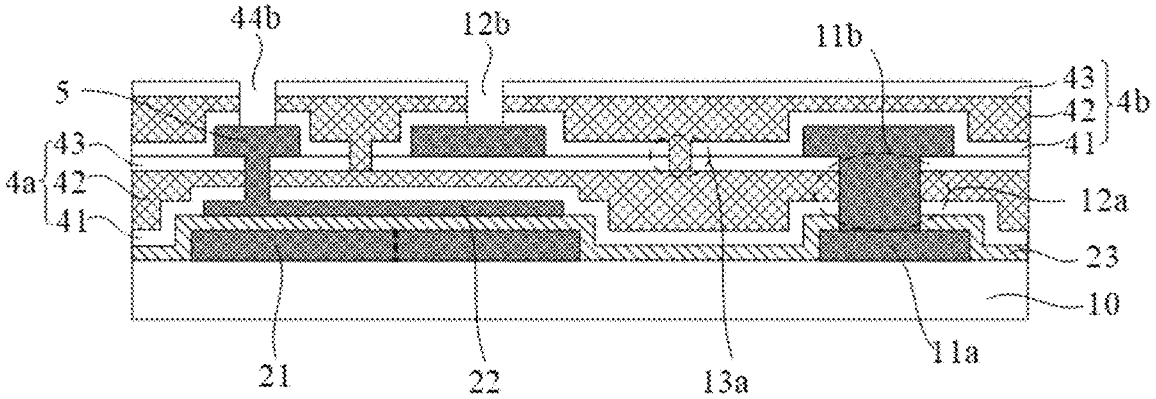
FIG. 8 is a sectional view of an intermediate product formed in step S16 of the method for manufacturing a base plate integrating passive devices according to an embodiment of the present disclosure.

S16, referring to FIG. 8, on the substrate base plate 10 that the above steps are completed, a second interlayer dielectric layer 4 is formed, and a 2nd first via hole 12*b* and a 2nd first adapting hole 44*b* penetrating the 2nd interlayer dielectric layer 4*b* are formed through a patterning process. Wherein an end of the second open ring portion 11*b* of the inductor 1 is exposed at the 2nd first via hole 12, and at least a portion of the adapting part 5 is exposed at the 2nd first adapting hole 44*b*.

In some embodiments, the 2nd interlayer dielectric layer 4*b* and the first interlayer dielectric layer 4*a* may adopt the same film layer structure, for example, including the first passivation layer 41, the planarization layer 42 and the second passivation layer 43 arranged in sequence away from the substrate base plate 10, hence the step of forming the 2nd first via hole 12*b* and the 2nd first adapting hole 44*b* may be the same as that of S14, and the description thereof will not be repeated here.

In some embodiments, when the 2nd interlayer dielectric layer 4*b* has the first passivation layer 41, the planarization layer 42 and the second passivation layer 43 arranged in sequence away from the substrate base plate 10, after the first passivation layer 41 of the 2nd interlayer dielectric layer 4*b* is formed, the second via hole 13 penetrating the second passivation layer 43 of the first interlayer dielectric layer 4*a* and the first passivation layer 41 of the 2nd interlayer dielectric layer 4*b* may further be formed, so that the planarization layer 42 of the first interlayer dielectric layer 4 and the planarization layer 42 of the 2nd interlayer dielectric layer 4 are in contact through a first second via hole 13*a*. The first second via hole 13*a* is equivalent to a gas-permeable channel so that water, oxygen and the like absorbed by the planarization layers 42 are let out.

Figure 9:
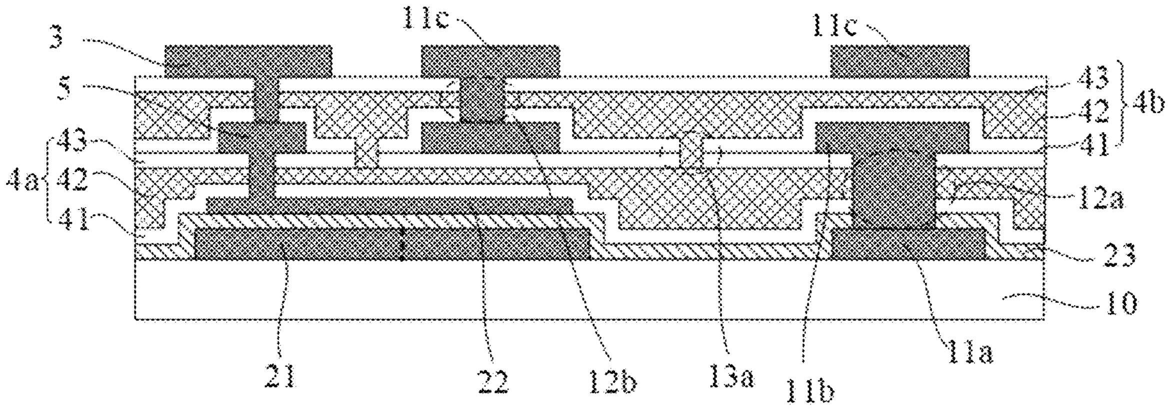
FIG. 9 is a sectional view of an intermediate product formed in step S17 of the method for manufacturing a base plate integrating passive devices according to an embodiment of the present disclosure.

S17, referring to FIG. 9, a 3rd open ring portion 11*c* of the inductor 1 and the first connecting portion 3 are formed on the substrate base plate 10 that the above steps are completed. Wherein, the 3rd open ring portion 11*c* is connected to an end of the 2nd open ring portion 11*b* through the 2nd first via hole 12*b*, and the first connecting portion 3 is connected to the adapting part 5 through the 2nd first adapting hole 44*b*.

The processing used to form the 3rd open ring portion 11*c* of the inductor 1 and the first connecting portion 3 formed in step S17 are the same as that of step S11 or S15, for example, by electroplating copper, hence the description thereof will not be repeated here.

Figure 10:
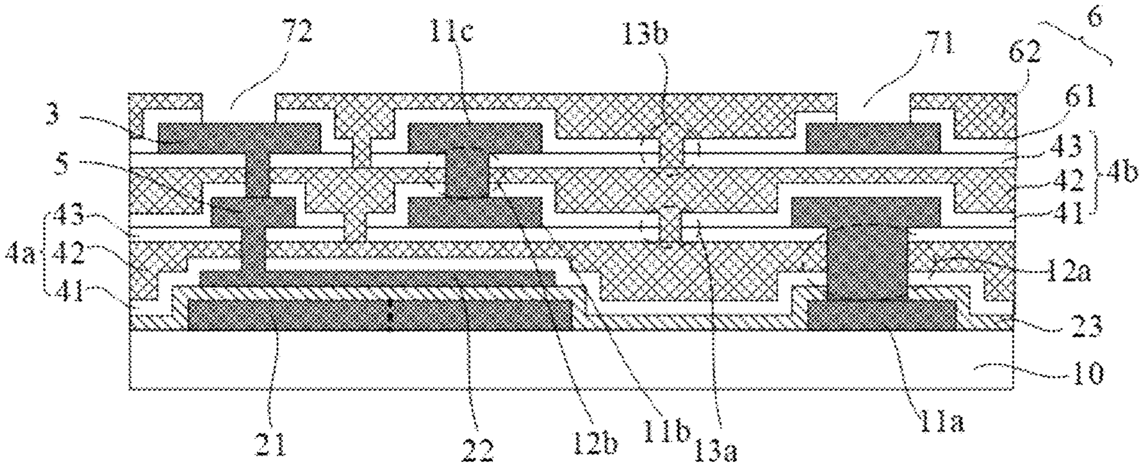
FIG. 10 is a sectional view of an intermediate product formed in step S18 of the method for manufacturing a base plate integrating passive devices according to the embodiment of the present disclosure.

S18, referring to FIG. 10, the protective layer 6 is formed on the substrate base plate 10 that the above steps are completed, and the third via hole 71 and the fourth via hole 72 penetrating the protective layer 6 are formed. Wherein, an end of the 3rd open ring portion 11c of the inductor 1 is exposed at the third via hole 71, and the first connecting portion 3 is exposed at the fourth via hole 72, thereby facilitating loading signals for the capacitor 2 and the inductor 1.

In some embodiments, the protective layer 6 may include the first passivation layer 61 and the planarization layer 61 described above, and in this case, the method further includes that after the first passivation layer 61 is formed, a 2nd second via hole 13b penetrating the first passivation layer 61 of the protective layer 6 and the second passivation layer 43 of the 2nd interlayer dielectric layer 4 may further be formed, so that the planarization layer 62 of the protective layer 6 and the planarization layer 42 of the 2nd interlayer dielectric layer 4 are in contact, and thus water, oxygen and the like absorbed by the planarization layers 42 are led out.

As such, the manufacturing of the base plate integrating passive devices according to the embodiments of the present disclosure is completed.

It is understood that the above embodiments are only exemplary embodiments adopted to illustrate the principles of the present disclosure, but the present disclosure is not limited thereto. For those of ordinary skill in the art, without departing from the spirit and essence of the present disclosure, various variants and improvements may be made, and these variants and improvements are also regarded as the scope of protection of the present disclosure.

The invention claimed is:

1. A base plate integrating passive devices, comprising a substrate base plate and the passive devices disposed on the substrate base plate, the passive devices comprising at least an inductor, the inductor comprising a plurality of open ring portions arranged and connected in sequence in a direction away from the substrate base plate, wherein an interlayer dielectric layer is disposed between the open ring portions disposed adjacently, and the open ring portions disposed adjacently are electrically connected through a first via hole penetrating the interlayer dielectric layer; orthographic projections of any two of the open ring portions on the substrate base plate at least partially overlap, and wherein the interlayer dielectric layer comprises a first passivation layer, a planarization layer, and a second passivation layer that are arranged in sequence in the direction away from the substrate base plate; the base plate comprises N interlayer dielectric layers; the planarization layer in an M-th interlayer dielectric layer is in contact with the planarization layer in an (M−1)-th interlayer dielectric layer through a second via hole penetrating the second passivation layer in the (M−1)-th interlayer dielectric layer and the first passivation layer in the M-th interlayer dielectric layer, wherein $N \geq 2$, $2 \leq M \leq N$, and both M and N are integers.

2. The base plate according to claim 1, wherein orthographic projections of the second via holes at least partially located in different layers on the substrate base plate at least partially overlap.

3. The base plate according to claim 2, wherein a number of the first via hole is plural, and orthographic projections of at least a portion of the plurality of first via holes on the substrate base plate have no overlap.

4. The base plate according to claim 2, wherein the passive devices further comprise a capacitor, the capacitor comprising a first polar plate and a second polar plate arranged in sequence at a side away from the substrate base plate; and the first polar plate is disposed in the same layer and of the same material as one of the plurality of open ring portions.

5. The base plate according to claim 1, wherein the planarization layer in the M-th interlayer dielectric layer is in contact with the planarization layer in the (M−1)-th interlayer dielectric layer through the plurality of second via holes.

6. The base plate according to claim 5, wherein a number of the first via hole is plural, and orthographic projections of at least a portion of the plurality of first via holes on the substrate base plate have no overlap.

7. The base plate according to claim 1, wherein a number of the first via hole is plural, and orthographic projections of at least a portion of the plurality of first via holes on the substrate base plate have no overlap.

8. The base plate according to claim 1, wherein the passive devices further comprise a capacitor, the capacitor comprising a first polar plate and a second polar plate arranged in sequence at a side away from the substrate base plate; and the first polar plate is disposed in the same layer and of the same material as one of the plurality of open ring portions.

9. The base plate according to claim 8, wherein the first polar plate is disposed in the same layer as and is directly electrically connected to a first one of the plurality of open ring portions arranged in the direction away from the substrate base plate.

10. The base plate according to claim 8, wherein a thickness ratio of the second polar plate to the first polar plate is 1:100 to 1:30.

11. The base plate according to claim 8, wherein the base plate further comprises a first connecting portion electrically connected to the second polar plate, and the first connecting portion is disposed in the same layer as a last one of the plurality of open ring portions arranged in the direction away from the substrate base plate.

12. The base plate according to claim 8, wherein the base plate further comprises an adapting part disposed in the same layer as any one or more of the plurality of open ring portions located between the first one and last one of the plurality of open ring portions.

13. The base plate according to claim 1, wherein the passive devices further comprise a capacitor, the capacitor comprising a first polar plate and a second polar plate arranged in sequence at a side away from the substrate base plate; and the first polar plate is disposed in the same layer and of the same material as one of the plurality of open ring portions.

14. A method for manufacturing a base plate integrating passive devices, comprising: providing a substrate base plate and forming the passive devices on the substrate base plate, the passive device comprising an inductor, the inductor comprising a plurality of open ring portions arranged and connected in sequence in a direction away from the substrate base plate, wherein a step of forming the inductor comprises forming a plurality of open ring portions in sequence on the substrate base plate and an interlayer dielectric layer being covered on the open ring portions, wherein the open ring portions disposed adjacently are electrically connected through a first via hole penetrating the interlayer dielectric layer, and orthographic projections of any two of the open ring portions on the substrate base plate at least partially overlap, and wherein the interlayer dielectric layer comprises a first passivation layer, a planarization layer, and a second passivation layer that are arranged in sequence in the direction away from the substrate base plate; the base plate comprises N interlayer dielectric layers; the planarization layer in an M-th interlayer dielectric layer is in contact with the planarization layer in an (M−1)-th interlayer dielectric layer through a second via hole penetrating the second passivation layer in the (M−1)-th interlayer dielectric layer and the first passivation layer in the M-th interlayer dielectric layer, wherein $N \geq 2$, $2 \leq M \leq N$, and both M and N are integers.

15. The method for manufacturing the base plate integrating passive devices according to claim 14, wherein the step of forming the open ring portions comprises:

forming a metal thin film as a seed layer on the substrate base plate;

forming a sacrificial layer at a side of the seed layer away from the substrate base plate, and etching the sacrificial layer to form slot portions corresponding to the open ring portions;

electroplating the seed layer so that metal materials are formed at the slot portions; and removing the seed layer, and removing the metal materials other than the metal materials at the slot portions through a patterning process, to form the open ring portions.

16. The method for manufacturing the base plate integrating passive devices according to claim 14, wherein the passive devices further comprise a capacitor, and a step of forming the capacitor comprises: forming a first polar plate and a second polar plate in sequence at a side away from the substrate base plate, wherein the first polar plate and one of the plurality of open ring portions are formed in a same patterning process.

17. The method for manufacturing the base plate integrating passive devices according to claim 16, wherein the first polar plate and a first one of the plurality of open ring portions arranged in the direction away from the substrate base plate are formed in the same patterning process.

* * * * *